(12) United States Patent
Nakaizumi (10) Patent No.: US 6,429,713 B2
(45) Date of Patent: Aug. 6, 2002

(54) D-FF CIRCUIT

(75) Inventor: Kazuo Nakaizumi, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/790,672

(22) Filed: Feb. 23, 2001

(30) Foreign Application Priority Data

Feb. 24, 2000 (JP) ........................................ 2000-048207

(51) Int. Cl.[7] ............................ H03K 3/289; H03K 3/12
(52) U.S. Cl. ...................................... 327/218; 327/202
(58) Field of Search ................................ 327/199, 201, 327/202, 203, 208, 210–215, 218, 225

(56) References Cited

U.S. PATENT DOCUMENTS

| | | | | |
|---|---|---|---|---|
| 5,081,377 A | * | 1/1992 | Freyman | ..................... 327/202 |
| 5,654,658 A | * | 8/1997 | Kubota et al. | ............... 202/203 |
| 5,789,957 A | * | 8/1998 | Fucili et al. | ................. 327/203 |
| 6,008,678 A | * | 12/1999 | Barber | ........................ 327/203 |
| 6,064,246 A | * | 5/2000 | Endo et al. | ................... 327/202 |
| 6,231,147 B1 | * | 5/2001 | Bosshart | ...................... 327/212 |
| 6,242,958 B1 | * | 6/2001 | Fletcher | ...................... 327/201 |

* cited by examiner

*Primary Examiner*—My-Trang Nuton
(74) *Attorney, Agent, or Firm*—Oliff & Berridge, PLC (57) ABSTRACT

A D-FF circuit for operating a master flip-flop and a slave flip-flop at each predetermined timing in accordance with a plurality of clock signals generated by a clock signal generating circuit, wherein the clock signal generating circuit generates the plurality of clock signals at different timings, the slave flip-flop starts operating in accordance with a clock signal which is generated at an earlier timing than another clock signal generated by the clock signal generating circuit, and the master flip-flop stops operating in accordance with a clock signal which is generated at a later timing than another clock signal generated by the clock signal generating circuit.

14 Claims, 5 Drawing Sheets

D-FF CIRCUIT

BACKGROUND OF THE INVENTION

1. Field of the Invention

The present invention relates to a D-FF circuit. In particular, the present invention relates to a D-FF circuit which is operated in accordance with a clock signal generated by a clock signal generating circuit.

2. Description of the Related Art

According to an earlier development, a D-flip-flop (hereinafter, referred to as "D-FF") made from CMOS (Complementary MOS) comprises a flip-flop for a master part (hereinafter, referred to as "master FF"), a flip-flop for a slave part (hereinafter, referred to as "slave FF") and a clock signal generating circuit. The clock signal generating circuit generates a clock signal to output the clock signal to the master FF and the slave FF. The master FF and the slave FF start or stop each operation at each timing in accordance with the outputted clock signal, respectively.

Figures 4A, 4B:
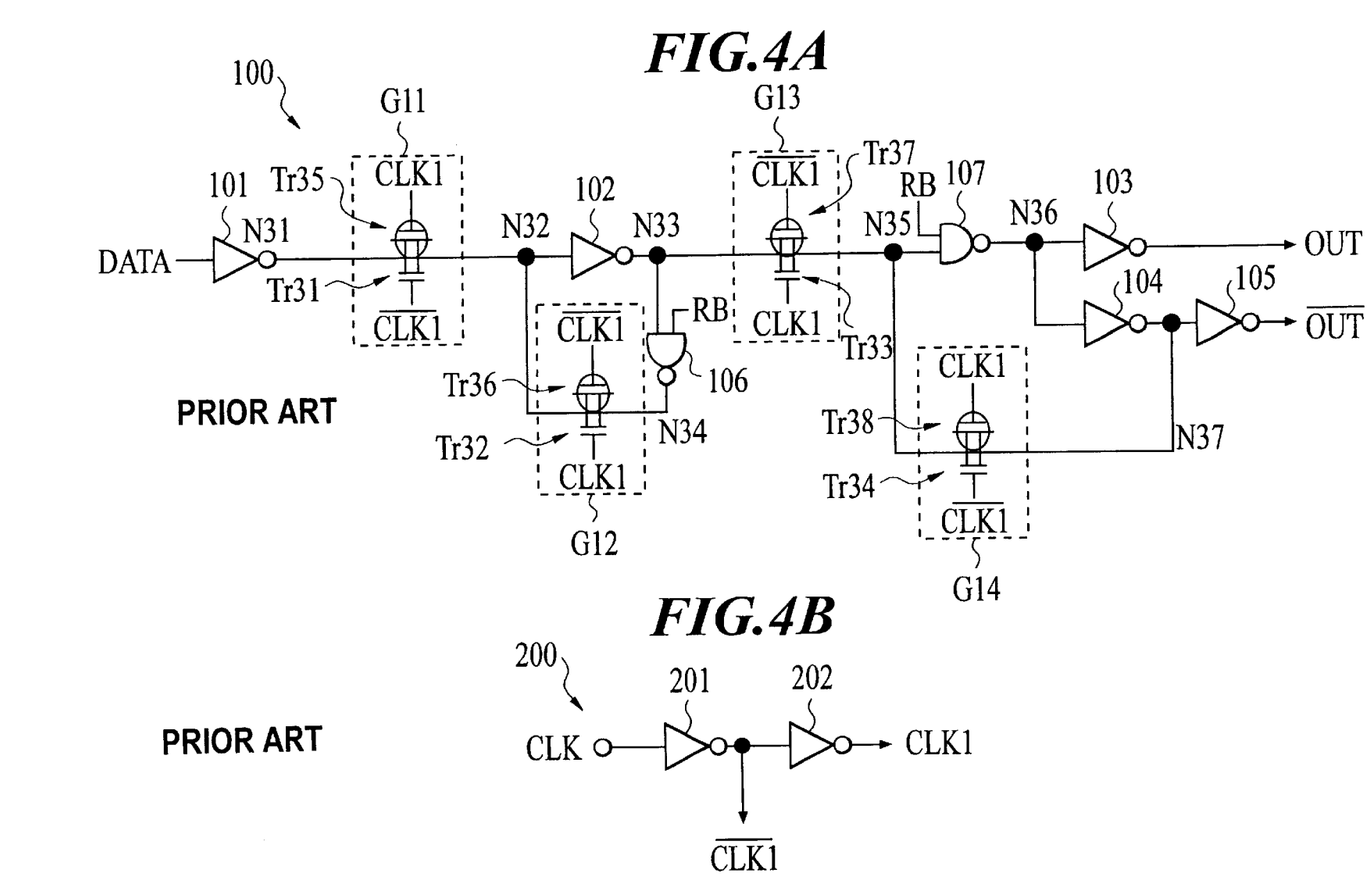
FIG. 4A is a view showing the D-FF circuit according to an earlier development and FIG. 4B is a view showing the clock signal generating circuit.
Figure 5:
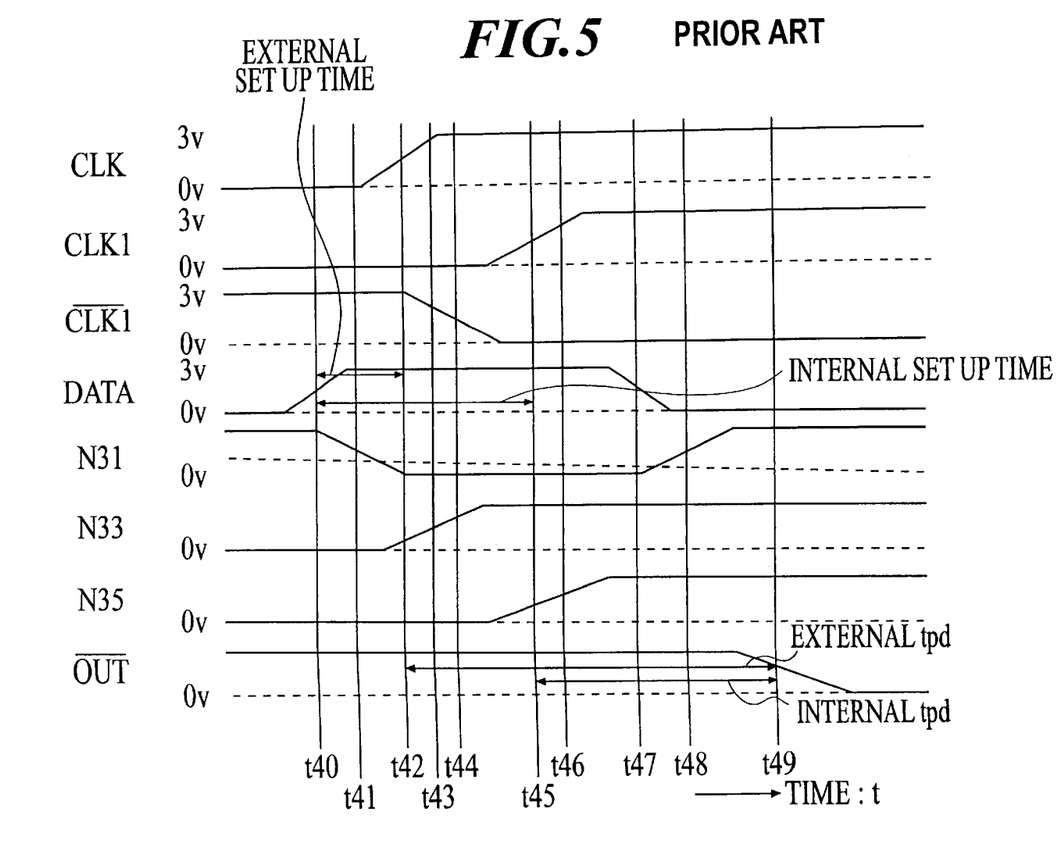
FIG. 5 is a timing chart showing the operation of the D-FF circuit according to an earlier development.

With reference to FIGS. 4 and 5, a D-FF circuit 100 according to an earlier development, will be explained.

FIGS. 4A and 4B are views showing a D-FF circuit made from CMOS according to an earlier development. FIG. 4A is a view showing a D-FF circuit 100. FIG. 4B is a view showing a clock signal generating circuit 200 of the D-FF circuit 100. FIG. 5 is a timing chart showing an operation of the D-FF circuit 100 according to an earlier development.

In FIG. 4A, the D-FF circuit 100 comprises a master FF having inverters 101 and 102, transfer gates G11 and G12 and a NAND gate 106, and a slave FF having transfer gates G13 and G14, a NAND gate 107 and inverters 103, 104 and 105. The master FF and the slave FF start or stop each operation in accordance with the clock signal outputted from the clock signal generating circuit 200, respectively.

The transfer gates G11, G12, G13 and G14 comprise P-channel transistors Tr35 to Tr38 and N-channel transistors Tr31 to Tr34, respectively. The clock signal outputted from the clock signal generating circuit 200 is inputted into each transistor Tr31 to Tr38. Each transfer gate G11, G12, G13 and G14 is in an "ON" state or in an "OFF" state according to the clock signal inputted into each transistor Tr31 to Tr38. These transfer gates hold or transmit an input signal data.

As shown in FIG. 4B, the clock signal generating circuit 200 comprises two inverters 201 and 202. The inverter 201 inverts an input clock signal CLK to output a first clock signal $\overline{CLK1}$. The inverter 202 inverts the first clock signal $\overline{CLK1}$ outputted from the inverter 201 to output a second clock signal CLK1.

The transfer gate G11 connects the output of the inverter 202 of the clock signal generating circuit 200 (the second clock signal CLK1) with a gate of the P-channel transistor Tr35. Further, the transfer gate G11 connects the output of the inverter 201 of the clock signal generating circuit 200 (the first clock signal $\overline{CLK1}$) with a gate of the N-channel transistor Tr31. Therefore, when the second clock signal $\overline{CLK1}$ is in a "H" level and the first clock signal $\overline{CLK1}$ is in a "L" level, the transfer gate G11 is in an "OFF" state and stops the operation of the master FF. The transfer gate G11 holds an input signal data.

The transfer gate G13 connects the output of the inverter 201 of the clock signal generating circuit 200 (the first clock signal $\overline{CLK1}$) with a gate of the P-channel transistor Tr37. Further, the transfer gate G13 connects the output of the inverter 202 of the clock signal generating circuit 200 (the second clock signal CLK1) with a gate of the N-channel transistor Tr33. Therefore, when the second clock signal CLK1 is in a "H" level and the first clock signal CLK1 is in a "L" level, the transfer gate G13 is in an "ON" state and starts the operation of the slave FF.

That is, in the D-FF circuit 100 according to an earlier development, the phases of two signals (the first clock signal $\overline{CLK1}$ and the second clock signal CLK1) are inverted. The clock signals are used as a clock signal for stopping the operation of the master FF and a clock signal for starting the operation of the slave FF, respectively.

In the timing chart shown in FIG. 5, when a "H" level input signal data is inputted at the time t40, the inverter 101 inverts the input signal data to output it. At the time t41, the voltage of the input signal data falls from a "H" level to a "L" level at a node N31. Because the transfer gate G11 is in an "ON" state at the same time, the inverted input signal data outputted from the inverter 101 is transmitted. Next, the inverter 102 inverts the signal transmitted from the transfer gate G11 to output it. Then, at the time t43, the voltage of the signal rises from a "L" level to a "H" level at a node N33.

On the other hand, when a "H" level input clock signal CLK is inputted into the clock signal generating circuit 200 at the time t42, the inverter 201 inverts the input clock signal CLK to output a "L" level first clock signal $\overline{CLK1}$. That is, at the time t44, the voltage of the first clock signal $\overline{CLK1}$ falls from a "H" level to a "L" level. The inverter 202 inverts the first clock signal $\overline{CLK1}$ to output a "H" level second clock signal CLK1. That is, at the time t45, the voltage of the second clock signal CLK1 rises from a "L" level to a "H" level.

The transfer gate G11 is in an "OFF" state by the first clock signal $\overline{CLK1}$ and the second clock signal CLK1 at the time t45. The operation of the master FF is stopped and the master FF holds the input signal data. At the same time, the transfer gate G13 is in an "ON" state and starts the operation of the slave FF.

When the operation of the slave FF is started, a "H" level signal passes through a node N35 at the time t46. At the time t49, an inverted "L" level output signal $\overline{OUT}$ is outputted.

In the above D-FF circuit 100, an internal set up time which is an effective accessible time for the input signal data is from the time t40 at which the data is inputted, to the time t45 at which the operation of the master FF is stopped. An effective internal tpd (Time for Propagation Delay) of the slave FF is the sum of the pass time of the slave FF and the pass time for generating the $\overline{CLK1}$, that is, from the time t45 to the time t49. Therefore, the operation speed (time) of the D-FF circuit 100 according to an earlier development is the sum of the set up time and the tpd, that is, from the time t40 to the time t49.

As described above, the D-FF circuit 100 according to an earlier development uses two signal having phases which are inverted each other. One signal stops the operation of the master FF to determine the set up time, and the other starts the operation of the slave FF to determine the tpd. Therefore, the set up time is almost restricted to the pass time of the master FF. The tpd is restricted to the pass time of the slave FF and the pass time for generating the CLK1. Because the operation speed of the D-FF circuit is determined by the sum of internal pass time, there is a problem that it is difficult to operate a D-FF circuit at high speed.

SUMMARY OF THE INVENTION

In order to solve the above-described problems, an object of the present invention is to operate a D-FF circuit at high speed in accordance with the clock signal generated by the clock signal generating circuit.

Figure 1A:
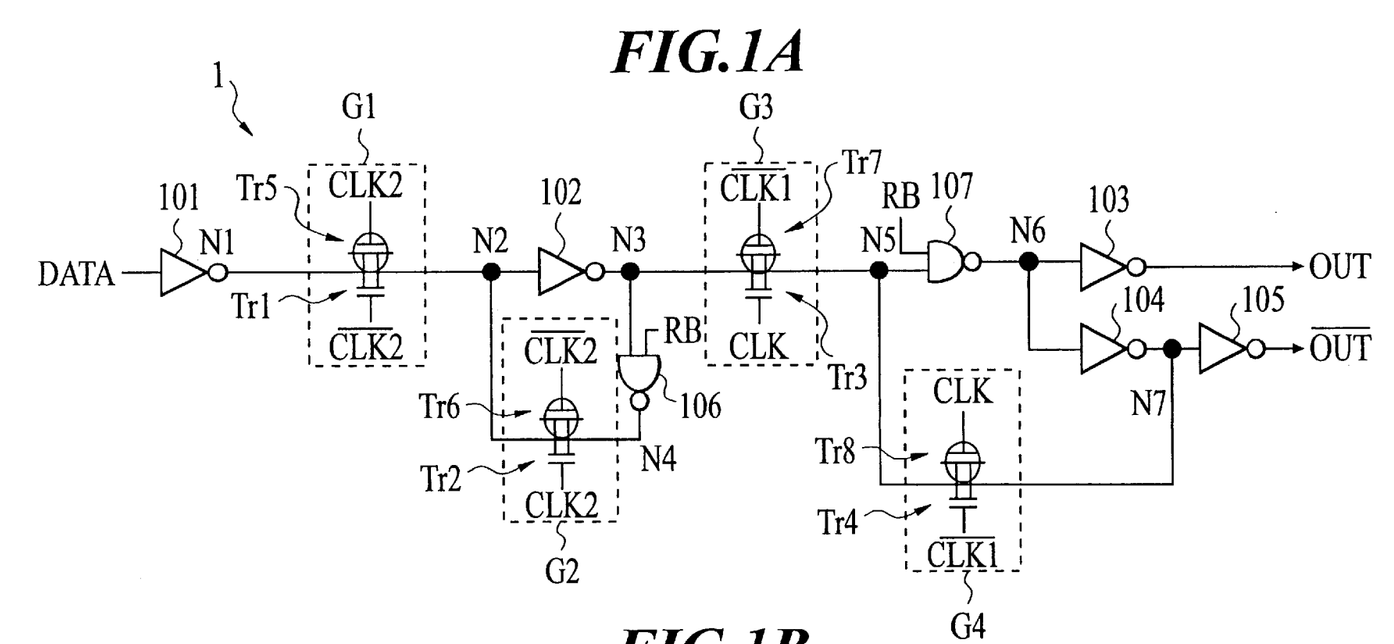
FIG. 1A is a view showing the D-FF circuit according to the first embodiment and FIG. 1B is a view showing the clock signal generating circuit according to the first embodiment.
Figure 1B:
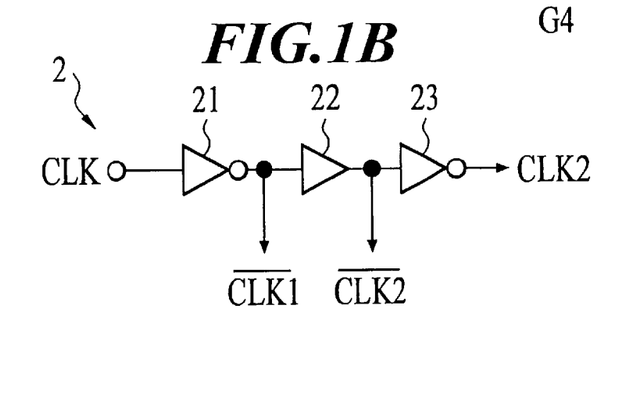

That is, in accordance with one aspect of the present invention, a D-FF circuit (for example, a D-FF circuit shown in FIG. 1A) for operating a master flip-flop and a slave flip-flop at each predetermined timing in accordance with a plurality of clock signals generated by a clock signal generating circuit (for example, a clock signal generating circuit 2 shown in FIG. 1B or a clock signal generating circuit 2' shown in FIG. 3), wherein the clock signal generating circuit generates the plurality of clock signals (for example, CLK, $\overline{CLK1}$, $\overline{CLK2}$, and CLK2 shown in FIG. 1B) at different timings, the slave flip-flop starts operating (for example, a transfer gate G3 shown in FIG. 1A) in accordance with a clock signal (CLK and $\overline{CLK1}$) which is generated at an earlier timing than another clock signal generated by the clock signal generating circuit, and the master flip-flop stops operating (for example, a transfer gate G1 shown in FIG. 1A) in accordance with a clock signal (CLK2 and $\overline{CLK2}$) which is generated at a later timing than another clock signal generated by the clock signal generating circuit.

According to the present invention, because the clock signal for stopping the operation of the master flip-flop is delayed and the clock signal for starting the operation of the slave flip-flop is advanced, it is possible to improve the set up time and the tpd. The operation speed of the D-FF circuit can be higher.

The clock signal generating circuit may comprise:

a first inverter (for example, an inverter 21 shown in FIG. 1B) for inverting an input clock signal (CLK) to output a first clock signal ($\overline{CLK1}$), a buffer (for example, a buffer 22 shown in FIG. 1B) for delaying the first clock signal outputted from the first inverter for a predetermined time to output a second clock signal ($\overline{CLK2}$), and a second inverter (for example, an inverter 23 shown in FIG. 1B) for inverting the second clock signal to output a third clock signal (CLK2);

wherein the slave flip-flop starts operating in accordance with the input clock signal (CLK) and the first clock signal ($\overline{CLK1}$) (for example, a transfer gate G3 shown in FIG. 1A), and the master flip-flop stops operating in accordance with the second clock signal ($\overline{CLK2}$) and the third clock signal (CLK2) (for example, a transfer gate G1 shown in FIG. 1A).

Because the clock signal for stopping the operation of the master flip-flop is delayed by the pass time of the buffer, it is possible to improve the set up time. Because the clock signal for starting the operation of the slave flip-flop is advanced by the pass time of the inverter, it is possible to improve the tpd. As a result, the operation speed (time) which is the sum of the set up time and the tpd, can be higher (shorten).

The clock signal generating circuit may comprise:

a first inverter (for example, an inverter 31 shown in FIG. 3) for inverting an input clock signal (CLK) to output a first clock signal ($\overline{CLK1}$), a second inverter (for example, an inverter 32 shown in FIG. 3) for inverting the first clock signal outputted from the first inverter to output a second clock signal (CLK1), a third inverter (for example, an inverter 33 shown in FIG. 3) for inverting the second clock signal outputted from the second inverter to output a third clock signal ($\overline{CLK2}$), and a fourth inverter (for example, an inverter 34 shown in FIG. 3) for inverting the third clock signal outputted from the third inverter to output a fourth clock signal (CLK2), wherein the slave flip-flop starts operating in accordance with the first clock signal ($\overline{CLK1}$) and the second clock signal (CLK1), and the master flip-flop stops operating in accordance with the third clock signal ($\overline{CLK2}$) and the fourth clock signal (CLK2).

The clock signal generating circuit comprises four inverters. The third clock signal and the fourth clock signal are used as clock signals for stopping the operation of the master flip-flop. The first clock signal and the second clock signal are used as clock signals for starting the operation of the slave flip-flop. Therefore, the timing at which the clock signals for stopping the operation of the master flip-flop are generated is delayed later than the timing at which the clock signals for starting the operation of the slave flip-flop are generated. The set up time can be improved. The operation speed of the D-FF circuit can be higher.

The clock signal generating circuit may comprise at least two inverters; a first inverter (for example, an inverter 31 shown in FIG. 3) inverting an input clock signal (CLK) to output a first clock signal ($\overline{CLK1}$) and a second inverter (for example, an inverter 32 shown in FIG. 3) inverting the first clock signal outputted from the first inverter to output a second clock signal ($\overline{CLK1}$);

wherein the slave flip-flop starts operating in accordance with the input clock signal (CLK) and the first clock signal ($\overline{CLK1}$), and the master flip-flop stops operating in accordance with the first clock signal ($\overline{CLK1}$) and the second clock signal (CLK1).

The clock signal generating circuit comprises at least two inverters. The input clock signal and the first clock signal are used as clock signals for starting the operation of the slave flip-flop. The first clock signal and the second clock signal are used as clock signals for starting the operation of the master flip-flop. Therefore, the timing at which the clock signals for starting the operation of the slave flip-flop are generated is advanced earlier than the timing at which the clock signals for stopping the operation of the master flip-flop are generated. The tpd can be improved. The operation speed of the D-FF circuit can be higher.

The master flip-flop and the slave flip-flop may be made from CMOS.

Because the D-FF circuit is made from CMOS, the operation speed thereof can be higher.

In accordance with another aspect of the present invention, a D-FF circuit comprises:

a master flip-flop, a slave flip-flop, and a clock signal generating circuit for generating at least two clock signals at different timings respectively;

wherein the slave flip-flop starts operating in accordance with one clock signal which is generated by the clock signal generating circuit earlier than another clock signal, and the master flip-flop stops operating in accordance with the another clock signal.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein.

PREFERRED EMBODIMENT OF THE INVENTION

Hereinafter, embodiments of the present invention will be explained in detail with reference to drawings.

First Embodiment

The construction of the D-FF circuit will be explained.

Figure 2:
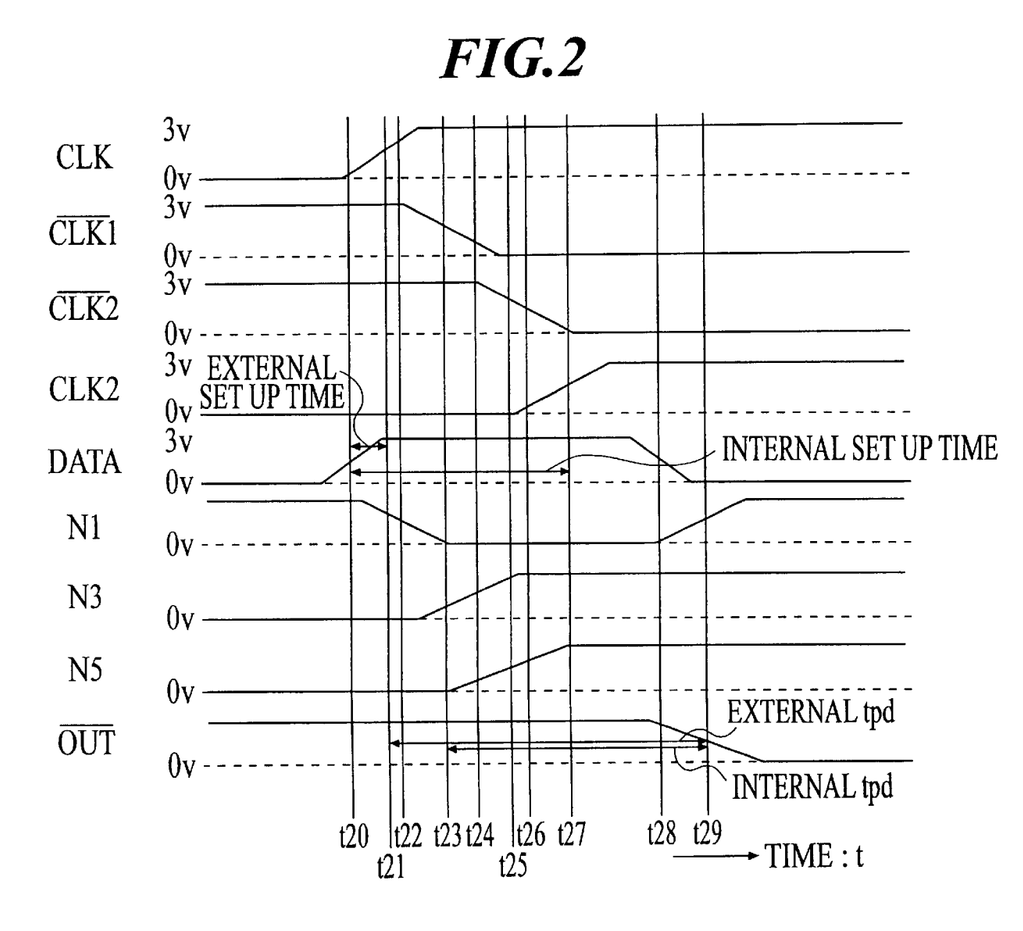
FIG. 2 is a timing chart showing the operation of the D-FF circuit according to the first embodiment.

FIGS. 1A and 1B are views showing a block diagram of a D-FF circuit made from CMOS according to the first embodiment. FIG. 1A is a view showing a D-FF circuit 1. FIG. 1B is view showing a clock signal generating circuit 2 of the D-FF circuit 1. FIG. 2 is a timing chart showing the operation of the D-FF circuit 1.

As shown in FIG. 1A, the D-FF (D-flip-flop) circuit 1 comprises a master FF having inverters 101 and 102, transfer gates G1 and G2 and a NAND gate 106, a slave FF having transfer gates G3 and G4, a NAND gate 107 and inverters 103, 104 and 105, and the clock signal generating circuit 2 shown in FIG. 1B. The master FF and the slave FF start or stop each operation in accordance with the clock signal outputted from the clock signal generating circuit 2, respectively.

As shown in FIG. 1B, the clock signal generating circuit 2 comprises two inverters 21 and 23 and a buffer 22 which is interposed between the two inverters. The inverter 21 inverts an input clock signal CLK to output a first clock signal $\overline{CLK1}$. The buffer 22 inputs the first clock signal $\overline{CLK1}$ outputted from the inverter 21 and then outputs a second clock signal $\overline{CLK2}$ after predetermined pass time elapses. The inverter 23 inverts the second clock signal $\overline{CLK2}$ outputted from the buffer 22 and outputs the third clock signal CLK2.

In the master FF, the inverter 101 inverts an input signal data and output it to the transfer gate G1. The inverter 102 inverts the signal data outputted when the transfer gate G1 is in an "ON" state, and outputs the inverted signal data to the NAND gate 106.

The transfer gates G1 and G2 have a structure in which a P-channel transistor and an N-channel transistor are incorporated. The clock signal outputted from the clock signal generating circuit 2 is inputted into each transistor Tr1, Tr2, Tr5 and Tr6 at each predetermined timing. These transistors carry out the switching operations of the transfer gates G1 and G2, that is, switch on or off the transfer gates in accordance with the input clock signal.

In the transfer gate G1, the output of the inverter 23 of the clock signal generating circuit 2 (the third clock signal CLK2) is connected with a gate of the P-channel transistor Tr5. Further, the output of the buffer 22 of the clock signal generating circuit 2 (the second clock signal $\overline{CLK2}$) is connected with a gate of the N-channel transistor Tr1. In the transfer gate G2, the output of the buffer 22 of the clock signal generating circuit 2 (the second clock signal $\overline{CLK2}$) is connected with a gate of the P-channel transistor Tr6. Further, the output of the inverter 23 of the clock signal generating circuit 2 (the third clock signal CLK2) is connected with a gate of the N-channel transistor Tr2.

When the third clock signal CLK2 is in a "H" level and the second clock signal $\overline{CLK2}$ is in a "L" level, the transfer gate G1 is in an "OFF" state and the transfer gate G2 is in an "ON" state. The operation of the master FF is stopped. The input signal data is held. In this case, when a reset signal is inputted into a reset terminal RB of the NAND gate 106, the master FF is reset. When the third clock signal CLK2 is in a "L" level and the second clock signal $\overline{CLK2}$ is in a "H" level, the transfer gate G1 is in an "ON" state and the transfer gate G2 is in an "OFF" state. The input signal is outputted to the slave FF.

The NAND gate 106 carries out the AND operation between the output signal of the inverter 102 and the reset signal inputted into the reset terminal RB, and outputs the inverted value of the AND operation to the transfer gate G2.

On the other hand, in the slave FF, the transfer gates G3 and G4 have a structure in which a P-channel transistor and an N-channel transistor are incorporated. The clock signal outputted from the clock signal generating circuit 2 is inputted into each transistor Tr3, Tr4, Tr7 and Tr8 at each predetermined timing. These transistors carry out the switching operations of the transfer gates G3 and G4, that is, switch on or off the transfer gates in accordance with the input clock signal.

In the transfer gate G3, the output of the inverter 21 of the clock signal generating circuit 2 (the first clock signal $\overline{CLK1}$) is connected with a gate of the P-channel transistor Tr7. Further, the input clock signal CLK of the clock signal generating circuit 2 is inputted into a gate of the N-channel transistor Tr3. In the transfer gate G4, the input clock signal CLK of the clock signal generating circuit 2 is inputted into a gate of the P-channel transistor Tr8. Further, the output of the inverter 21 of the clock signal generating circuit 2 (the first clock signal $\overline{CLK1}$) is connected with a gate of the N-channel transistor Tr4.

When the first clock signal $\overline{CLK1}$ is in a "H" level and the input clock signal CLK is in a "L" level, the transfer gate G3 is in an "OFF" state and the transfer gate G4 is in an "ON" state. When the first clock signal $\overline{CLK1}$ is in a "L" level and the input clock signal CLK is in a "H" level, the transfer gate G3 is in an "ON" state and the transfer gate G4 is in an "OFF" state. The operation of the slave FF is started.

The NAND gate 107 carries out the AND operation between the output signal of the transfer gate G3 and the reset signal inputted into the reset terminal RB, and outputs the inverted value of the AND operation to the inverter 103 and the inverter 104. The inverter 103 inverts the signal outputted from the NAND gate 107 and outputs an output signal OUT. The inverter 104 inverts the signal outputted from the NAND gate 107 and outputs it to the inverter 105. The inverter 105 inverts the signal outputted from the inverter 104 and outputs an output signal $\overline{OUT}$.

Next, the operation of the first embodiment will be explained.

In the timing chart shown in FIG. 2, when the voltage of the input signal data rises from a "L" level to a "H" level at the time t20, the inverter 101 inverts the input signal data to output a "L" level signal. Therefore, at the time t22, the voltage of the signal falls from a "H" level to a "L" level at a node N1.

At the same time, because the voltage of the third clock signal CLK2 is in a "L" level and that of the second clock signal $\overline{\text{CLK2}}$ is in a "H" level, the transfer gate G1 is in an "ON" state. The inverter 101 outputs a "L" level signal to the inverter 102 through the transfer gate G1. The inverter 102 inverts a "L" level signal to output a "H" level signal. Therefore, at the time t24, the voltage of the signal rises from a "L" level to a "H" level at a node N3.

On the other hand, in the clock signal generating circuit 2, the voltage of the input clock signal CLK rises from a "L" level to a "H" level at the time t21. The period from the time that the input data is inputted to the time that the voltage of the input clock signal rises, is referred to as "external set up time." In the first embodiment, the external set up time is from the time t20 to the time t21.

The input clock signal CLK is inverted by the inverter 21. At the time t23, the inverted signal is outputted as a "L" level first clock signal $\overline{\text{CLK1}}$. Therefore, because the voltage of the input clock signal CLK is in a "H" level and that of the first clock signal $\overline{\text{CLK1}}$ is in a "L" level, the transfer gate G3 is in an "ON" state. The operation of the slave FF is started.

In case that the operation of the slave FF is started at the time t23, a "H" level signal which passes through the node N3 passes through the transfer gate G3 at the time t24. At the time t25, the voltage of the signal rises from a "L" level to a "H" level at the node N5.

At the time t26, the first clock signal $\overline{\text{CLK1}}$ passes through the buffer 22 of the clock signal generating circuit 2. The "L" level second clock signal $\overline{\text{CLK2}}$ is outputted.

At the time t27, the inverter 23 of the clock signal generating circuit 2 inverts the second clock signal $\overline{\text{CLK2}}$ to output the "H" level third clock signal CLK2. Then, the transfer gate G1 is in an "OFF" state. The operation of the master FF is stopped. The input signal data is held.

The period from the time t20 to the time t27 is an effective accessible time for the input signal data, which is from the time that the data is inputted to the time that the operation of the master FF is stopped. The period is referred as "internal set up time." Because the clock signal which passed through the buffer 22 is used as a clock signal for stopping the operation of the master FF, the effective accessible time for the input signal data can be extended by the pass time (from the time t23 to the time t26) of the buffer 22. Further, in the state that the internal set up time (from the time t20 to the time t27) is the same length as that of the D-FF circuit 100 (from the time t40 to the time t45 shown in FIG. 5) according to an earlier development, the external set up time (from the time t20 to the time t21) can be shortened.

At the time t29, the inverters 104 and 105 of the slave FF invert the signal outputted from the NAND gate 107 to output the output signal $\overline{\text{OUT}}$.

As explained above, the clock signal generating circuit 2 of the D-FF circuit 1 comprises two inverters 21 and 23 and the buffer 22 which is interposed between the two inverters 21 and 23. The input clock signal CLK and the first clock signal $\overline{\text{CLK1}}$ outputted from the first inverter 21 are used as clock signals for starting the operation of the slave FF. The second clock signal $\overline{\text{CLK2}}$ outputted from the buffer 22 and the third clock signal CLK2 outputted from the inverter 23 are used as clock signals for stopping the operation of the master FF.

As compared with the D-FF circuit according to an earlier development, the timing (time t27) at which the clock signal for stopping the operation of the master FF is inputted, is delayed by the pass time (from the time t23 to the time t26) of the buffer 22. The timing (time t23) at which the clock signal for starting the operation of the slave FF is inputted, is advanced by the pass time of one inverter.

Therefore, as shown in FIG. 2, the effective accessible time for the input signal data is extended. In the state that the internal set up time (from the time t20 to the time t27) is the same length as that of the D-FF circuit 100, the external set up time (from the time t20 to the time t21) which is a time period from the data input to the rising of the input clock signal CLK, can be improved by the pass time (from the time t23 to the time t25) of the buffer 22. Further, in the state that the internal tpd (from the time t23 to the time t29) which is an effective tpd, is the same length as that of the D-FF circuit 100, the external tpd which is a time period from the time that the voltage of the input clock signal is varied to the time that the data is outputted, can be improved.

As a result, the operation speed (time) of the D-FF circuit, which is the sum of the external set up time and the external tpd, is shorten. The D-FF circuit can be operated at a high speed. In the concrete, when the clock signal for stopping the operation of the master FF is delayed, the set up time can be improved by the pass time of the buffer 22, that is, about 300 ps. When the timing at which the clock signal for starting the operation of the slave FF is inputted, is advanced, the external tpd can be improved by the pass time of the inverter, that is, about 150 ps. The operation (the set up time+the tpd) of the D-FF circuit can be shortened about 450 ps. The D-FF circuit can be operated more speedily by about 30 percent.

Although the D-FF circuit 1 made from CMOS, to which the present invention is applied, is explained in the present embodiment, the present invention is not limited to this. Needless to say, the present invention can be applied to the D-FF circuit having another structure.

Second Embodiment

Figure 3:
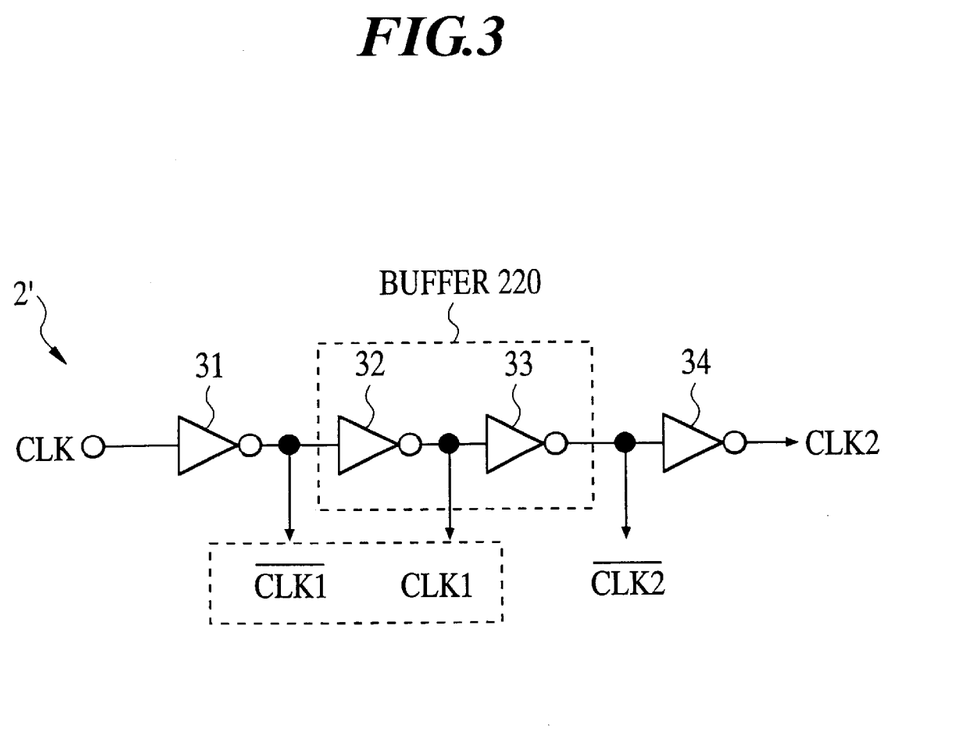
FIG. 3 is a view showing the clock signal generating circuit according to the second and third embodiments.

Although the clock signal generating circuit 2 has a structure in which one buffer 22 is interposed between two inverters 21 and 23 in the D-FF circuit 1 of the above first embodiment, the clock signal generating circuit 2' of the second embodiment has a structure in which the buffer 220 has two inverters. That is, the clock signal generating circuit 2' has four inverters.

FIG. 3 is a view showing the clock signal generating circuit 2' in the D-FF circuit according to the second embodiment. The structure of the D-FF circuit is the same as that of the D-FF circuit shown in FIG. 1A. Therefore, the drawings showing the structure of the D-FF circuit and the detail explanations thereof are omitted.

As shown in FIG. 3, in the second embodiment, the clock generating circuit 2' has four inverters 31, 32, 33 and 34.

The inverter 31 inverts an input clock signal CLK and outputs a first clock signal $\overline{\text{CLK1}}$. The inverter 32 inverts the first clock signal $\overline{\text{CLK1}}$ and outputs a second clock signal CLK1. The inverter 33 inverts the second clock signal CLK1 to output a third clock signal $\overline{\text{CLK2}}$. The inverter 34 inverts the third clock signal $\overline{\text{CLK2}}$ and outputs a fourth clock signal CLK2.

In the second embodiment, the third clock signal $\overline{\text{CLK2}}$ and fourth clock signal $\overline{\text{CLK2}}$ are used as clock signals for stopping the operation of the master FF. The first clock signal $\overline{\text{CLK1}}$ and the second clock signal CLK1 are used as clock signals for starting the operation of the slave FF. That is, in order to start the operation of the slave FF, the same clock signals ($\overline{\text{CLK1}}$ and CLK1) as the D-FF circuit 100 according to an earlier development, are used. In order to stop the operation of the master FF clock signals, the clock signals ($\overline{CLK2}$ and CLK2) which are generated later than the clock signals for starting the operation of the slave FF, are used.

In this case, because the clock signal generating circuit 2' can delay the clock signal for stopping the operation of the master FF as compared with the clock signal generating circuit according to an earlier development, it is possible to improve the external set up time. Therefore, the operation speed of the D-FF circuit can become higher.

Third Embodiment

In the third embodiment, the clock signal generating circuit of the D-FF circuit comprises four inverters 31, 32, 33 and 34 like the clock signal generating circuit 2' shown in FIG. 3 according to the second embodiment. The structure of the D-FF circuit is the same as that of the D-FF circuit shown in FIG. 1A. Therefore, the drawings showing the structure of the D-FF circuit and the detail explanations thereof are omitted.

In the third embodiment, the input clock signal CLK of the clock signal generating circuit 2' and the first clock signal $\overline{CLK1}$ are used as clock signals for starting the operation of the slave FF. The first clock signal $\overline{CLK1}$ and the second clock signal CLK1 are used as clock signals for stopping the operation of the master FF. That is, in order to stop the operation of the master FF, the same clock signals ($\overline{CLK1}$ and CLK1) as the D-FF circuit 100 according to an earlier development, are used. In order to start the operation of the slave FF, the clock signals (CLK and $\overline{CLK1}$) which are generated earlier than the clock signals for stopping the operation of the master FF, are used.

In this case, because the clock signal generating circuit can advance the clock signal for starting the operation of the slave FF as compared with the clock signal generating circuit according to an earlier development, it is possible to improve the external tpd. Therefore, the operation speed of the D-FF circuit can become higher.

Because only the clock signals outputted from the first inverter 31 and the second inverter 32 are used in the D-FF circuit of the third embodiment, the clock signal generating circuit does not have to comprise four inverters like the clock signal generating circuit 2'. As a modified example of the third embodiment, the clock signal generating circuit may comprise two inverters 21 and 22 as shown in FIG. 4B. The input clock signal CLK and the first clock signal $\overline{CLK1}$ are used as clock signals for starting the operation of the slave FF. The first clock signal $\overline{CLK1}$ and the second clock signal CLK1 are used as clock signals for stopping the operation of the master FF. Therefore, the same effect as the third embodiment can be obtained.

According to the present invention, because the clock signal for stopping the operation of the master flip-flop is delayed and the clock signal for starting the operation of the slave flip-flop is advanced, it is possible to improve the set up time and the tpd. The operation speed of the D-FF circuit can be higher.

Further, because the clock signal for stopping the operation of the master flip-flop is delayed by the pass time of the buffer, it is possible to improve the set up time. Because the clock signal for starting the operation of the slave flip-flop is advanced by the pass time of the inverter, it is possible to improve the tpd. As a result, the operation speed (time) which is the sum of the set up time and the tpd, can be higher (shorten).

Further, the clock signal generating circuit comprises four inverters. The third clock signal and the fourth clock signal are used as clock signals for stopping the operation of the master flip-flop. The first clock signal and the second clock signal are used as clock signals for starting the operation of the slave flip-flop. Therefore, the timing at which the clock signals for stopping the operation of the master flip-flop are generated is delayed later than the timing at which the clock signals for starting the operation of the slave flip-flop are generated. The set up time can be improved. The operation speed of the D-FF circuit can be higher.

The clock signal generating circuit comprises at least two inverters. The input clock signal and the first clock signal are used as clock signals for starting the operation of the slave flip-flop. The first clock signal and the second clock signal are used as clock signals for stopping the operation of the master flip-flop. Therefore, the timing at which the clock signals for starting the operation of the slave flip-flop are generated is advanced earlier than the timing at which the clock signals for stopping the operation of the master flip-flop are generated. The tpd can be improved. The operation speed of the D-FF circuit can be higher.

Because the D-FF circuit is made from CMOS, the operation speed thereof can be higher.

The entire disclosure of Japanese Patent Application No. Tokugan 2000-48207 filed on Feb. 24, 2000 including specification, claims drawings and summary are incorporated herein by reference in its entirety.

What is claimed is:

1. A D-FF circuit for operating a master flip-flop and a slave flip-flop at each predetermined timing in accordance with a plurality of clock signals generated by a clock signal generating circuit, wherein the clock signal generating circuit generates the plurality of clock signals at different timings, the slave flip-flop starts operating in accordance with one or more earlier generated clock signals which are generated by the clock signal generating circuit, and the master flip-flop stops operating in accordance with one or more later generated clock signals which are generated by the clock signal generating circuit later than one of the earlier clock signals.

2. The D-FF circuit as claimed in claim 1, wherein the clock signal generating circuit comprises:

a first inverter for inverting an input clock signal to output a first clock signal, a buffer for delaying the first clock signal outputted from the first inverter for a predetermined time to output a second clock signal, and a second inverter for inverting the second clock signal to output a third clock signal;

wherein the slave flip-flop starts operating in accordance with the input clock signal and the first clock signal, and the master flip-flop stops operating in accordance with the second clock signal and the third clock signal.

3. The D-FF circuit as claimed in claim 1, wherein the clock signal generating circuit comprises:

a first inverter for inverting an input clock signal to output a first clock signal, a second inverter for inverting the first clock signal outputted from the first inverter to output a second clock signal, a third inverter for inverting the second clock signal outputted from the second inverter to output a third clock signal, and a fourth inverter for inverting the third clock signal outputted from the third inverter to output a fourth clock signal, wherein the slave flip-flop starts operating in accordance with the first clock signal and the second clock signal, and the master flip-flop stops operating in accordance with the third clock signal and the fourth clock signal.

4. The D-FF circuit as claimed in claim 1, wherein the clock signal generating circuit comprises at least two inverters; a first inverter inverting an input clock signal to output a first clock signal and a second inverter inverting the first clock signal outputted from the first inverter to output a second clock signal;

wherein the slave flip-flop starts operating in accordance with the input clock signal and the first clock signal, and the master flip-flop stops operating in accordance with the first clock signal and the second clock signal.

5. The D-FF circuit as claimed in claim 1, wherein the master flip-flop and the slave flip-flop are made from CMOS.

6. A D-FF circuit set comprising:

a D-FF circuit comprising: a master flip-flop, and a slave flip-flop; and a clock signal generating circuit for generating at least two or more clock signals at different timings respectively;

wherein the slave flip-flop starts operating in accordance with one or more earlier generated clock signals which are generated by the clock signal generating circuit, and the master flip-flop stops operating in accordance with one or more later generated clock signals which are generated by the clock signal generating circuit later than one of the earlier clock signals.

7. The D-FF circuit set as claimed in claim 6, wherein the clock signal generating circuit comprises:

a first inverter for inverting an input clock signal to output a first clock signal;

a buffer for delaying the first clock signal outputted from the first inverter for a predetermined time to output a second clock signal; and a second inverter for inverting the second clock signal to output a third clock signal;

wherein the slave flip-flop starts operating in accordance with the input clock signal and the first clock signal, and the master flip-flop stops operating in accordance with the second clock signal and the third clock signal.

8. The D-FF circuit set as claimed in claim 6, wherein the clock signal generating circuit comprises:

a first inverter for inverting an input clock signal to output a first clock signal;

a second inverter for inverting the first clock signal outputted from the first inverter to output a second clock signal;

a third inverter for inverting the second clock signal outputted from the second inverter to output a third clock signal; and a fourth inverter for inverting the third clock signal outputted from the third inverter to output a fourth clock signal;

wherein the slave flip-flop starts operating in accordance with the first clock signal and the second clock signal, and the master flip-flop stops operating in accordance with the third clock signal and fourth clock signal.

9. The D-FF circuit set as claimed in claim 6, wherein the clock signal generating circuit comprises at least two inverters; a first inverter inverting an input clock signal to output a first clock signal, and a second inverter inverting the first clock signal outputted from the first inverter to output a second clock signal;

wherein the slave flip-flop starts operating in accordance with the input clock signal and the first clock signal, and the master flip-flop stops operating in accordance with the first clock signal and the second clock signal.

10. The D-FF circuit set as claimed in claim 6, wherein the master flip-flop and the slave flip-flop are made from CMOS.

11. A D-FF circuit, comprising:

a clock generator that generates a first clock and a second clock, the second clock being generated from the first clock;

a master flip-flop that stops operating based on the generated second clock; and a slave flip-flop that starts operating based on the generated first clock.

12. The D-FF circuit as claimed in claim 11, wherein the clock generator comprises:

a first inverter for inverting an input clock to output the first clock;

a buffer for delaying the first clock outputted from the first inverter for a predetermined time to output the second clock; and a second inverter for inverting the second clock to output a third clock;

wherein the slave flip-flop starts operating in accordance with the input clock and the first clock, and the master flip-flop stops operating in accordance with the second clock and the third clock.

13. The D-FF circuit as claimed in claim 11, wherein the clock generator comprises:

a first inverter for inverting an input clock to output the first clock;

a second inverter for inverting the first clock outputted from the first inverter to output the second clock;

a third inverter for inverting the second clock outputted from the second inverter to output a third clock; and a fourth inverter for inverting the third clock outputted from the third inverter to output a fourth clock;

wherein the slave flip-flop starts operating in accordance with the first clock and the second clock, and the master flip-flop stops operating in accordance with the third clock and fourth clock.

14. The D-FF circuit as claimed in claim 11, wherein the clock generator comprises at least two inverters; a first inverter inverting an input clock to output the first clock, and a second inverter inverting the first clock outputted from the first inverter to output the second clock;

wherein the slave flip-flop starts operating in accordance with the input clock and the first clock, and the master flip-flop stops operating in accordance with the first clock and the second clock.

* * * * *